US 6,630,829 B1
Oct. 7, 2003

(12) United States Patent
Liu

(54) GRADIENT COIL SET CAPABLE OF PRODUCING A VARIABLE FIELD OF VIEW

(75) Inventor: Qin Liu, Waukesha, WI (US)

(73) Assignee: GE Medical Systems Global Technology Co., LLC, Waukesha, WI (US)

( * ) Notice: Subject to any disclaimer, the term of this patent is extended or adjusted under 35 U.S.C. 154(b) by 0 days.

(21) Appl. No.: 10/063,421

(22) Filed: Apr. 22, 2002

(51) Int. Cl.[7] .............................................. G01V 3/00
(52) U.S. Cl. ...................................... 324/318; 324/319
(58) Field of Search ................................. 324/318, 319, 324/321, 322, 300, 306, 307, 309, 312, 314

(56) References Cited

U.S. PATENT DOCUMENTS

| 4,881,034 | A | 11/1989 | Kaufman et al. | |
|---|---|---|---|---|
| 5,136,273 | A | 8/1992 | Ohta | |
| 5,311,135 | A | 5/1994 | Vavrek et al. | 324/318 |
| 5,406,205 | A | 4/1995 | Muller | 324/318 |
| 5,646,531 | A | 7/1997 | Renz | |
| 5,647,362 | A | 7/1997 | Fuderer et al. | |
| 5,736,858 | A | 4/1998 | Katznelson et al. | 324/318 |
| 5,760,583 | A | 6/1998 | Sato et al. | |
| 5,917,324 | A | 6/1999 | Leussler | |
| 5,928,148 | A | 7/1999 | Wang et al. | |
| 5,986,454 | A | 11/1999 | Leifer | |
| 5,998,999 | A | 12/1999 | Richard et al. | |
| 6,054,854 | A | 4/2000 | Kawamoto | |
| 6,060,883 | A | 5/2000 | Knuttel | |
| 6,137,291 | A | 10/2000 | Szumowski et al. | |
| 6,147,493 | A | 11/2000 | Miyoshi | |
| 6,150,816 | A | 11/2000 | Srinivasan | |
| 6,175,237 | B1 | 1/2001 | Doty et al. | |
| 6,208,140 | B1 | 3/2001 | Gebhardt et al. | 324/309 |
| 6,223,065 | B1 | 4/2001 | Misic et al. | |
| 6,236,208 | B1 | 5/2001 | Ham et al. | 324/318 |
| 6,294,972 | B1 | 9/2001 | Jesmanowicz et al. | 335/301 |
| 6,297,635 | B1 | * 10/2001 | Arz et al. | 324/318 |
| 6,384,601 | B1 | * 5/2002 | Wiesler et al. | 324/309 |

* cited by examiner

*Primary Examiner*—Louis Arana
(74) *Attorney, Agent, or Firm*—Ziolkowski Patent Solutions Group, LLC; Michael A. Della Penna; Carl B. Horton

(57) ABSTRACT

The present invention is directed to a coil assembly capable of producing a flexible FOV for use with an MRI system. The coil assembly includes a gradient coil disposed about an imaging axis and a plurality of higher order gradient coils, or shim coils, positioned about the primary gradient coil such that the plurality of higher gradient order coils have a radius greater than the radius of the primary gradient coil. A change in the FOV is realized by modulating the current in the higher order gradient coils or shim coils.

32 Claims, 4 Drawing Sheets

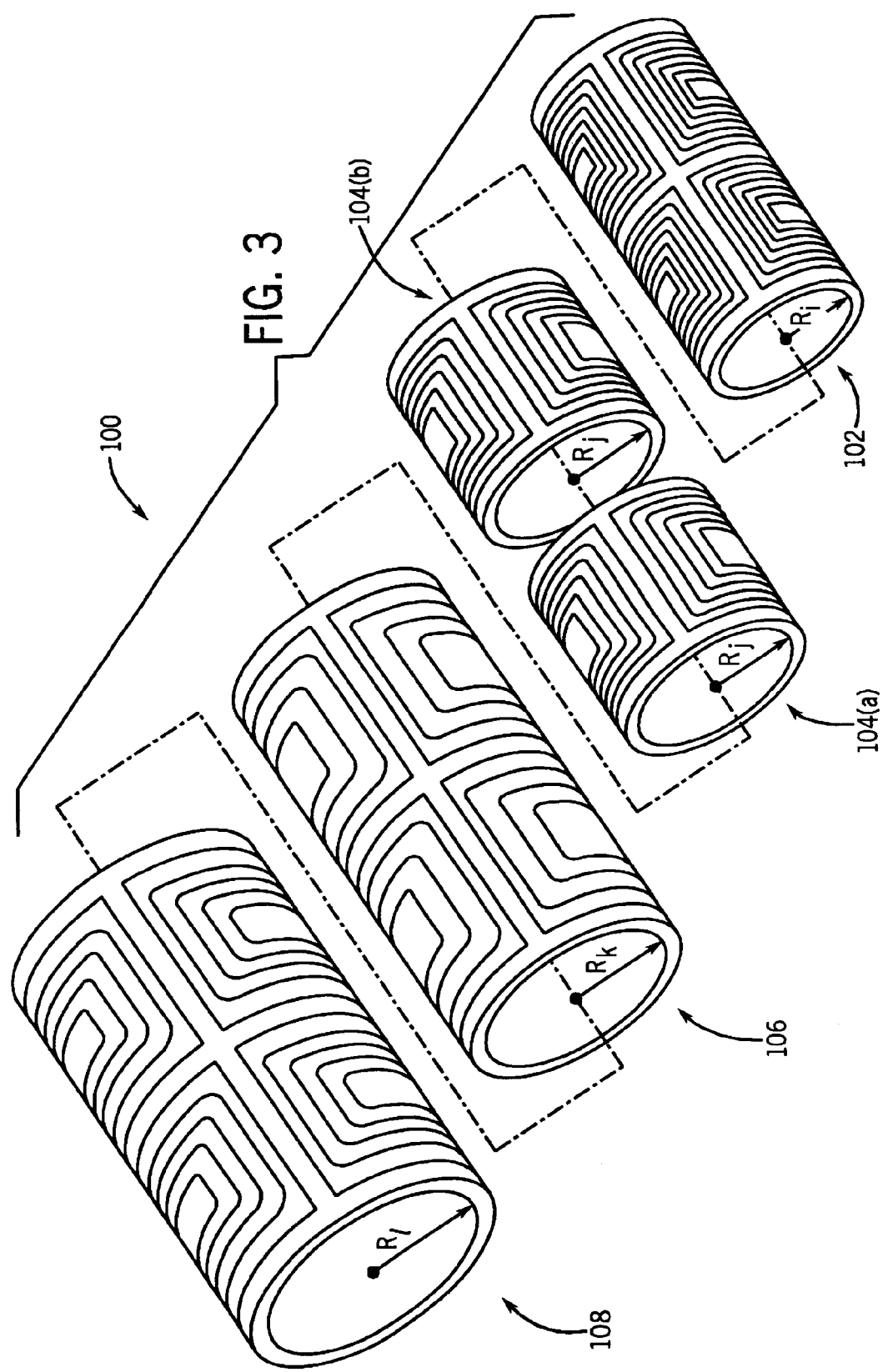

GRADIENT COIL SET CAPABLE OF PRODUCING A VARIABLE FIELD OF VIEW

BACKGROUND OF INVENTION

The present invention relates generally to magnetic resonance imaging (MRI), and more particularly, to a gradient coil set having higher order gradient coils arranged about a gradient coil and constructed to allow improved field-of-view adjustment.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The use of gradient coils to generate a gradient field about the bore of a magnet for imaging is known in the art of nuclear magnetic resonance imaging. Generally, a patient is positioned on an examination table and inserted into a bore of a magnet. The magnet provides a uniform magnetic field $B_0$ throughout the bore. The gradient coils extend around the bore and are energized to impose time varying magnetic fields on the uniform magnetic field.

Conventional gradient coils have a fixed field-of-view (FOV). It is generally well known that the larger the FOV, the lower the efficiency rating for that respective coil. That is, a gradient coil with a large FOV requires more power to produce a given gradient strength than a gradient coil with a small FOV. Since coil inductance increases with FOV size, the slew rate of a gradient coil with a large FOV is reduced for a given power supply. Additionally, since high dB/dt is associated with larger FOVs, which can result in peripheral nerve stimulation, imaging protocols requiring high gradient power and high slew rate are generally performed on MRI systems equipped with a small FOV gradient set.

A number of improvements have been developed to provide more than one FOV for the gradient field in MRI systems. One approach is to integrate two sets of gradient coils on one system to provide, at most, three distinct FOV sizes. Manufacturing a coil with this approach is relatively straight forward, however, coil efficiency is greatly reduced. Another approach requires the disabling or enabling of certain parts of the gradient coil windings to adjust the FOV. With this approach, coil efficiency is improved, but such systems require switches within the coil windings to enable or disable part of the windings thereby increasing manufacturing and implementation complexity.

It would therefore be desirable to have a system and method of MR imaging incorporating a gradient coil set capable of infinitely variable FOV adjustments that maintain coil efficiency without the need for costly switching.

BRIEF DESCRIPTION OF INVENTION

The present invention provides a system and method of MR imaging implementing a gradient coil set with variable FOV adjustments overcoming the aforementioned drawbacks.

In accordance with one aspect of the invention, a coil assembly with flexible FOV for use with an MR imaging system comprises a gradient coil disposed about an imaging axis to produce a gradient field. The gradient coil has a first end and a second end. The coil assembly further includes a higher order gradient coil, a first portion of the higher order gradient coil positioned overlapping at least a portion of the first end of the gradient coil and a second portion of the higher order gradient coil positioned overlapping at least a portion of the second end of the gradient coil.

In accordance with another aspect of the invention, an MRI apparatus to vary the imaging FOV is disclosed. The apparatus includes an MRI system having a number of gradient coils positioned about a bore of a magnet to produce a polarizing magnetic field and an RF transceiver system and an RF modulator controlled by a pulse control module to transmit RF signals to an RF coil assembly to acquire MR images. The MRI apparatus also includes at least one higher order gradient coil disposed about an imaging axis and configured to adjust gradient field linearity and generally disposed about the plurality of gradient coils and a control to vary the FOV by modulating current in the at least one higher order gradient coil.

In accordance with a further aspect of the invention, a method of manufacturing a coil assembly for an MR imaging apparatus is provided. The method includes positioning a primary gradient coil about a bore of a magnet wherein the primary gradient coil has a first and a second end. The method further includes the step of positioning a first portion of a higher order gradient coil circumferentially about at least a portion of the first end and positioning a second portion of the higher order gradient coil circumferentially about at least a portion of the second end. The first and the second portions are positioned such that the first portion overlaps the first end of the primary gradient coil and the second portion overlaps the second end of the primary gradient coil.

In accordance with yet another aspect of the present invention, a method of producing a variable FOV with an MR system having a gradient coil to produce a gradient field and an independent higher order gradient coil is provided. The method includes the step of energizing the gradient coils and the higher order gradient coil with a current to produce a gradient field of magnetic field gradients to spatially encode acquired signals in an FOV. The method also includes modulating the current in the independent higher order gradient coil to vary the FOV.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings:

FIG. 3 is an exploded view of the gradient coil set shown in FIG. 2.

DETAILED DESCRIPTION

Figure 1:
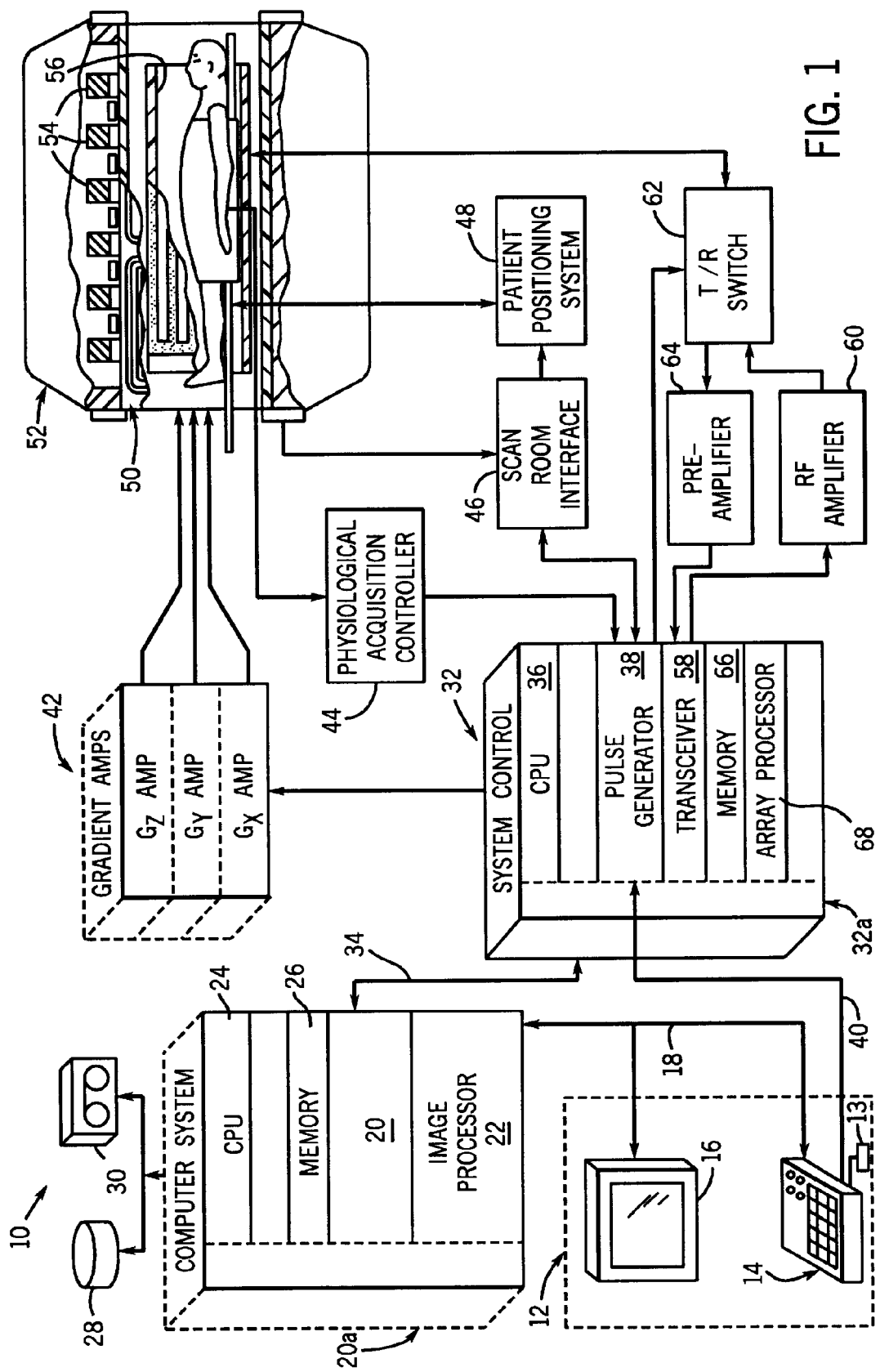
FIG. 1 is a schematic block diagram of an MR imaging system for use with the present invention.

A system is shown and described to acquire MR images capable of infinitely variable field-of-view (FOV) adjustments. Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display or screen 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory and/or other storage media, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
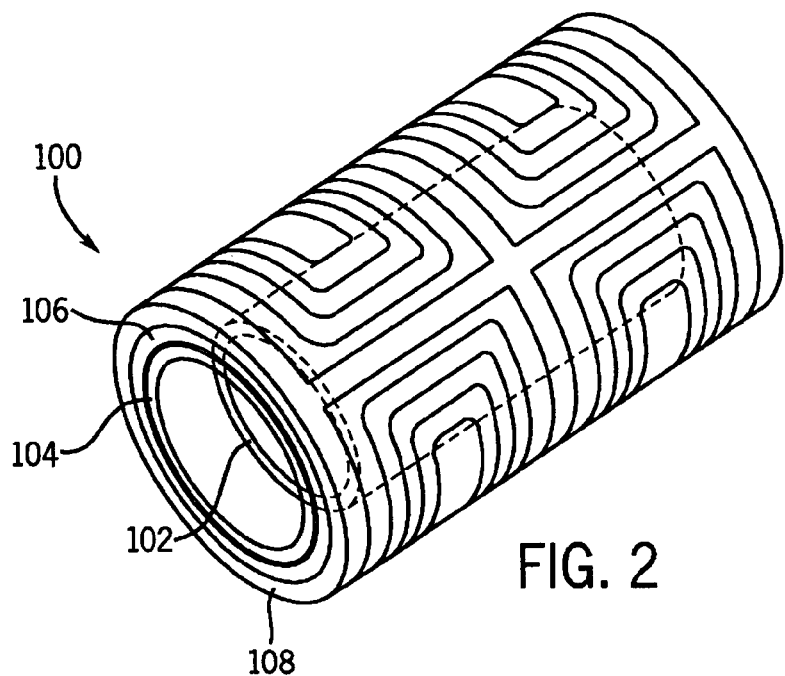
FIG. 2 is a perspective view of a gradient coil set in accordance with one embodiment of the present invention.

Referring to FIG. 2, one embodiment of a gradient coil assembly 100 for use with an MRI system such as that disclosed with reference to FIG. 1 is shown. Gradient coil assembly 100 includes a primary gradient coil 102 shown in phantom. Coil assembly 100 further includes a primary higher order gradient coil assembly 104. Coil assembly 104 includes a first half 104(a) and a second half 104(b). Positioned circumferentially about coil 104 is a secondary higher order gradient coil 106. Coil 106 operates as a shielding coil for the primary higher order gradient coil assembly 104. Shielding coil 106 assists in preventing eddy current from being induced in magnet 52 of FIG. 1. Coil assembly 100 further includes a secondary gradient coil 108 disposed circumferentially about coil 106. Coil 108 functions as a shielding coil for the primary gradient coil 102 and likewise operates to prevent eddy current from being induced in the magnet.

FIG. 3 is an exploded view of coil assembly 100 of FIG. 2 which illustrates the concentric characteristics of coil assembly 100. Coil assembly 100 is designed such that primary gradient coil 102 has a radius $R_i$ wherein $R_i$ is less than $R_j$, the radius of the primary higher order gradient coil 104. Likewise, $R_j$ is less than $R_k$, the radius of secondary higher order gradient coil 106. Secondary gradient coil 108 has a radius $R_l$ that exceeds the radius of secondary shim coil 106. As a result, gradient coil assembly 100 is designed such that coil 102 is disposed interiorially of coil 104. Moreover, coil 104 is designed to be positioned interiorially of coil 106 which is likewise designed to be positioned in an interior of coil 108.

Figure 4:
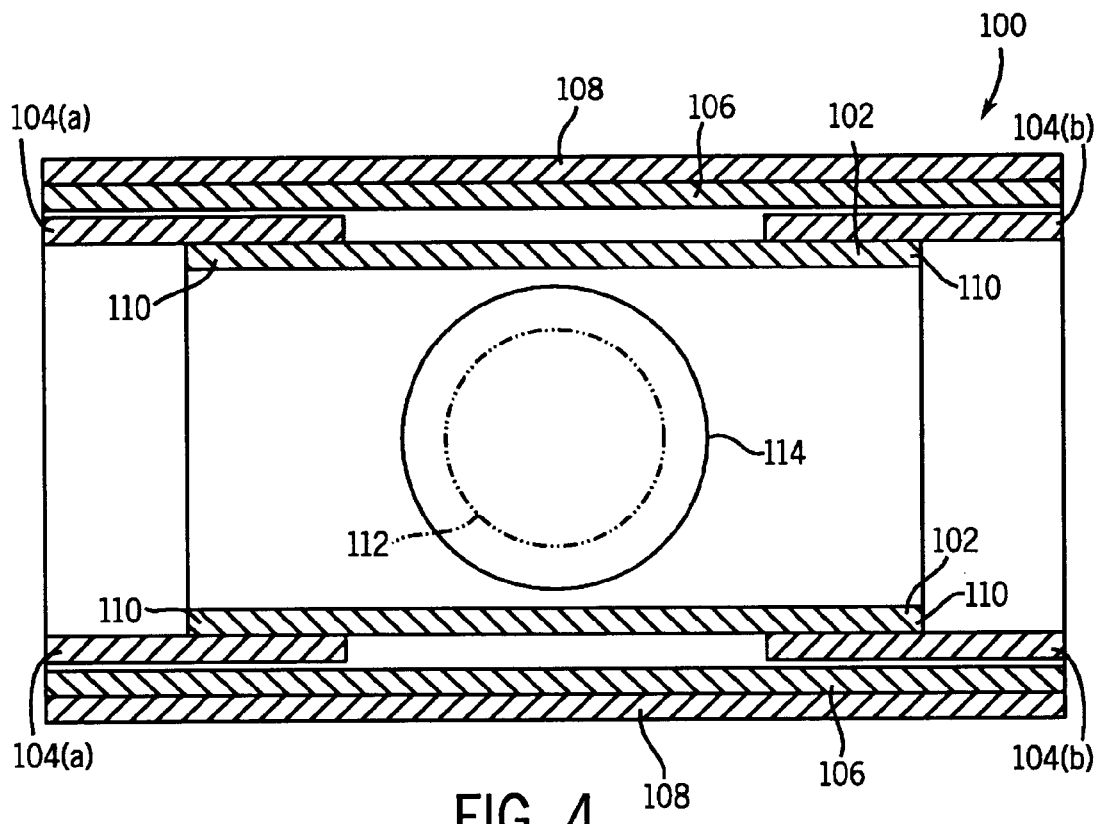
FIG. 4 is a cross-sectional view of the gradient coil set shown in FIG. 2.

Referring now to FIG. 4, a cross-sectional view of the coil assembly 100 is shown. FIG. 4 illustrates the concentric nature of coil assembly 100. As indicated previously, coil 102 is disposed in the interior of coil 104 which is disposed in the interior of coil 106, which together are disposed in the interior of coil 108. As indicated, FOV 112 is associated with gradient coil 102 and is smaller than FOV 114 which is associated with the entire coil assembly 100. Use of the higher order gradient coil 104 enables increasing the size of FOV 112 to FOV 114 incrementally, or with infinite variability.

The operating modes include operating the gradient coil 102 alone or connecting coil 102 and coil 104 in series to provide a larger FOV, such as FOV 114. It should be noted that coil 102 and coil 104 may be jointly operated to create a smaller FOV than that generated by coil 102 alone. Additionally, coils 102 and 104 may be driven in parallel by separate power supplies to produce variable linearity within the FOV. As indicated previously, shielding coils such as coils 106 and 108 may be implemented to prevent eddy current from being induced in the magnet.

By integrating gradient coil 102 with higher order gradient coil 104, the FOV may be varied by adjusting the current in coil 104. For example, considering the x gradient, the z component of the field generated by an x gradient coil may be expanded in terms of the spherical harmonics as illustrated in the following equation:

$$B_{zg} = G_x x + a_3 Hc_{3f} + a_5 Hc_{5f} + \ldots, \qquad \text{Eqn. 1}$$

where $Hc_{n1}$, $n=3, 5, \ldots$, are the solid spherical harmonic functions. $G_x$ is the gradient strength as determined by the gradient coil and coefficients, $a_n$, determine the linearity of the gradient or FOV. One or more higher order gradient coils or shim coils are designed to generate the z component of the field as defined by the following equation:

$$B_{zs} = b_3 Hc_{31} + b_{51} + \ldots \qquad \text{Eqn. 2}$$

As a result, the total gradient field generated by gradient coil 102 and higher order gradient coil 104 may be given by:

$$B_z = G_x x + (a_{3+} b_3) Hc_{31} + (a_5 b_5) Hc_{51} + \ldots \qquad \text{Eqn. 3}$$

Equation 3 illustrates that by varying the sign and/or magnitude of $b_n$, the linearity for the field of view of the total gradient field may be changed. The sign and magnitude of $b_n$ can be varied by changing the polarity and magnitude of the current to the higher order gradient coil, together or independently. As indicated previously, modifying the current in the higher order gradient or shim coil increases or decreases the FOV. Therefore, it is evident that this "shim coil" satisfies the same type of requirements as a conventional gradient coil, unlike traditional shim coils used for magnetic field shimming. As is known, such requirements include low inductance and resistance with high efficiency ratings.

Figure 5:
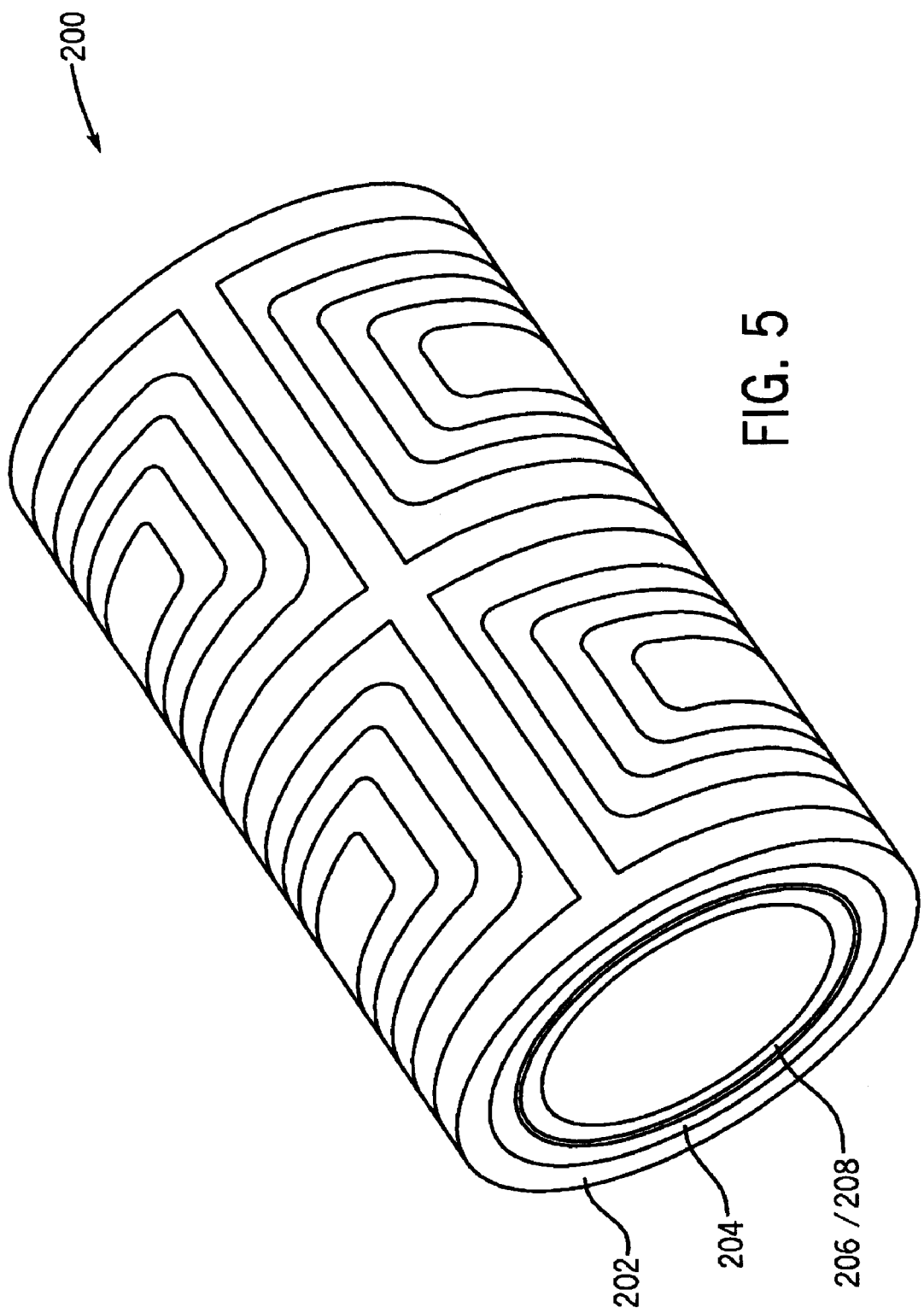
FIG. 5 is a perspective view of a gradient coil set in accordance with another embodiment of the present invention.

Referring now to FIG. 5, an alternate embodiment of a gradient coil assembly in accordance with the present invention is shown. In this embodiment, coil assembly 200 includes a secondary gradient coil 202 operating as a shielding coil for a primary gradient coil 208. Coil assembly 200 further includes a secondary higher order gradient coil 204 operating as a shielding coil for a primary higher order gradient coil 206. In this embodiment, primary gradient coil 208 and primary higher order gradient coil assembly 206 are placed on the same surface, therefore, there is no overlap between the two coils. Combined coil set 206 and 208 is then concentrically located with respect to coil 204 which is disposed in the interior of coil 202. That is, coils 206 and 208 have the same radius whereas the radius of coil 204 is greater than the radii of coils 206 and 208 but less than the radius of coil 202. Similarly to the coil assembly 100 of FIGS. 2–4, modulating the current in coil assembly 206 enables modification of the FOV in the same infinite manner within the physical bounds of the coils.

In accordance with one embodiment of the invention, a coil assembly with flexible FOV for use with an MR imaging system comprises a gradient coil disposed about an imaging axis to produce a gradient field. The gradient coil has a first end and a second end. The coil assembly further includes a first portion of a higher order gradient coil positioned overlapping at least a portion of the first end of the gradient coil and a second portion of the higher order gradient coil positioned overlapping at least a portion of the second end of the gradient coil.

In accordance with another embodiment of the invention, an MRI apparatus to vary the imaging FOV is disclosed. The apparatus includes an MRI system having a number of gradient coils positioned about a bore of a magnet to produce a polarizing magnetic field and an RF transceiver system and an RF modulator controlled by a pulse control module to transmit RF signals to an RF coil assembly to acquire MR images. The MRI apparatus also includes at least one independent higher order gradient coil disposed about an imaging axis and configured to adjust gradient field linearity in the imaging axis and generally disposed about the plurality of gradient coils and a control to vary the FOV by modulating current in the at least one higher order gradient coil based on reception of instructions.

In accordance with a further embodiment of the invention, a method of manufacturing a coil assembly for an MR imaging apparatus is provided. The method includes positioning a primary gradient coil about a bore of a magnet wherein the primary gradient coil has a first and a second end. The method further includes the step of positioning a first portion of a higher order gradient coil circumferentially about at least a portion of the first end and positioning a second portion of the higher order gradient coil circumferentially about at least a portion of the second end. The first and the second portions of the higher order gradient coil are positioned such that the first portion of the higher order gradient coil overlaps the first end of the primary gradient coil and the second portion of the higher order gradient coil overlaps the second end of the primary gradient coil.

In accordance with yet another embodiment of the present invention, a method of producing a variable FOV with an MR system having a gradient coil to produce a gradient field and an independent higher order gradient coil is provided. The method includes the step of energizing the gradient coils and the higher order gradient coil with a current to produce a gradient field of magnetic field gradients to spatially encode acquired signals in an FOV. The method also includes modulating the current in the independent higher order gradient coil to vary the FOV.

The present invention has been described in terms of the preferred embodiment, and it is recognized that equivalents, alternatives, and modifications, aside from those expressly stated, are possible and within the scope of the appending claims.

What is claimed is:

1. An MRI system comprising:
   a magnetic resonance imaging (MRI) system has a gradient coil positioned about a bore of a magnet to produce a polarizing magnetic field and an RF transceiver system and an RF switch controlled by a pulse module to transmit RF signals to an RF coil assembly to acquire MR images of a field-of-view (FOV);
   at least one independent higher order gradient coil configured to adjust gradient field linearity and generally disposed about an imaging axis; and
   a control to vary the FOV by modulating current in the at least one higher order gradient coil based on a reception of instructions.

2. The MRI system of claim 1 wherein the control varies the FOV by modulating at least one of a magnitude and a polarity of the current in the at least one higher order gradient coil.

3. The MRI system of 1 wherein the at least one higher order gradient coil and the plurality of gradient coils are arranged in series and the control provides a larger FOV or a smaller FOV than an FOV associated with the gradient coil alone based on an operator input.

4. The MRI system of claim 1 wherein the control is further configured to drive the at least one higher order gradient coil and the gradient coil in parallel by a separate power supply to produce variable linearity within the FOV.

5. The MRI system of claim 1 wherein the at least one higher order gradient coil is configured to prevent eddy current inducement in the magnet.

6. The MRI system of claim 1 wherein the at least one higher order gradient coil has portions overlapping ends of the gradient coil.

7. The MRI system of claim 6 wherein the at least one higher order gradient coil has a radius exceeding a radius of the gradient coil.

8. The MRI system of claim 1 wherein the gradient coil includes a secondary gradient coil and further comprising a secondary higher order gradient coil disposed interiorly of the secondary gradient coil wherein the at least one higher order gradient coil is disposed in an interior of the secondary higher order gradient coil and the gradient coil is disposed in an interior of the at least one higher order gradient coil.

9. The MRI system of claim 1 wherein the control energizes the at least one higher order gradient coil to change a linearity of the gradient coil without affecting an efficiency of the gradient coil.

10. A method of producing a variable FOV with an MR system having a gradient coil to produce a gradient field and an independent higher order gradient coil, the method comprising the steps of:
   energizing the gradient coils and the independent higher order gradient coil with a current to produce a gradient field of magnetic field gradients to spatially encode acquired signals in an FOV; and
   modulating the current in the independent higher order gradient coil to vary the FOV.

11. The method of claim 10 wherein the step of modulating further includes the step of changing at least one of magnitude and polarity of the current energizing the independent higher order gradient coil.

12. An MRI system comprising:
   a magnetic resonance imaging (MRI) apparatus having a first gradient coil positioned about an imaging axis and a second gradient coil positioned about the imaging axis such that the first gradient coil is concentric of the second gradient coil wherein the first and the second gradient coil are positioned about a bore of a magnet to produce a polarizing magnetic field, the MRI apparatus further comprising an RF transceiver system and an RF switch controlled by a pulse module to transmit RF signals to an RF coil assembly to acquire MR images of a field-of-view (FOV); and
   a control to selectively energize the first and, the second gradient coils to generate a gradient field having indefinite variability about the FOV.

13. The MRI system of claim 12 further comprising a pair of shielding coils positioned about the first and the second gradient coils about the imaging axis.

14. The MRI system of claim 12 further comprising a first power supply and a second power supply and wherein the control is further configured to connect the first power supply to the first gradient coil and the second power supply to the second gradient coil in parallel to produce the gradient field about the FOV.

15. The MRI system of claim 12 wherein the control is further configured to vary the FOV by modulating current in the second gradient coil based on a reception of instructions.

16. The MRI system of claim 12 wherein the control varies the FOV by modulating at least one of a magnitude and a polarity of the current in the second gradient coil.

17. The MRI system of claim 12 wherein the first and the second gradient coils are arranged in series and the control provides a larger FOV or a smaller FOV than an FOV associated with the first gradient coil alone based on an operator input.

18. The MRI system of claim 12 wherein the second gradient coil has portions overlapping ends of the first gradient coil.

19. A coil assembly with variable FOV for use with an MR imaging sytem, the coil assembly comprising:
   a gradient coil disposed about an imaging axis to produce a gradient field, the gradient coil having a first end and a second end;
   a first portion of a higher order gradient coil positioned overlapping at least a portion of the first end of the gradient coil; and
   a second portion of the higher order gradient coil positioned overlapping at least a portion of the second end of the gradient coil.

20. The coil assembly of claim 19 wherein the higher order gradient coil is designed to produce low inductance and resistance and high efficiency.

21. The coil assembly of claim 19 wherein the gradient coil has a radius, $R_i$, and the higher order gradient coil has a radius, $R_j$, wherein $R_j$ is not less than $R_i$.

22. The coil assembly of claim 21 further comprising a shielding coil for the higher order gradient coil and disposed about the imaging axis wherein the shielding coil has a radius $R_k$, wherein $R_k$ is greater than or equal to $R_j$.

23. The coil assembly of claim 22 further comprising a second gradient coil disposed about the imaging axis, wherein the second gradient coil operates as a shielding coil for the gradient coil and has a radius $R_l$, wherein $R_l$ is greater than or equal to $R_k$.

24. The coil assembly of claim 19 wherein the higher order gradient coil is a shim coil constructed to adjust linearity of the gradient field.

25. A method of manufacturing a coil assembly for an MR imaging apparatus, the method comprising the steps of:
   positioning a primary gradient coil about a bore of a magnet, the primary gradient coil having a first and a second end;
   positioning a first portion of a higher order gradient coil circumferentially about the first end such that the portion overlaps at least a portion of the first end; and
   positioning a second portion of a higher order gradient coil circumferentially about the second end such that the second portion overlaps at least a portion of the second end.

26. The method of claim 25 further comprising the step of positioning the portions in a common plane.

27. The method o f claim 25 further comprising the step of positioning a secondary higher order gradient coil circumferentially about the higher order coil and the primary gradient coil.

28. The method of claim 27 further comprising the step of positioning a secondary gradient coil circumferentially about the secondary higher order coil.

29. The method of claim 28 wherein:
   the primary gradient coil has a radius $R_i$;

the higher order gradient coil has a radius $R_j$;

the secondary higher order coil has a radius $R_k$;

the secondary gradient coil has a radius $R_l$; and $R_i < R_j < R_k < R < R_l$.

30. The method of claim 29 further comprising the step of positioning the first and the second portions to extend overlappingly about the first and the second ends of the primary gradient coil, respectively.

31. The method of claim 28 wherein:

the primary gradient coil hdas a radius $R_i$;

the higher order coil has a radius $R_j$;

the secondary higher order coil has a radius $R_k$;

the secondary gradient coil has a radius $R_l$; and wherein $R_i = R_j < R_k < R_i$.

32. The method of claim 31 further comprising the step of coaxially arranging the higher order gradient coil and the primary gradient coil.

* * * * *

UNITED STATES PATENT AND TRADEMARK OFFICE
CERTIFICATE OF CORRECTION

PATENT NO.    : 6,630,829 B1
DATED         : October 7, 2003
INVENTOR(S)   : Qin Liu It is certified that error appears in the above-identified patent and that said Letters Patent is hereby corrected as shown below:

Column 9,
Line 4, delete "$R_i < R_j < R_k < R < R_l$" and substitute therefor -- $R_i < R_j < R_k < R_l$ --;
Line 10, delete "hdas" and substitute -- has --.

Signed and Sealed this

Thirtieth Day of December, 2003

JAMES E. ROGAN
*Director of the United States Patent and Trademark Office*